United States Patent
Thompson et al.

(10) Patent No.: US 7,135,123 B1
(45) Date of Patent: Nov. 14, 2006

(54) METHOD AND SYSTEM FOR INTEGRATED CIRCUIT BACKSIDE NAVIGATION

(75) Inventors: Mark Alan Thompson, Austin, TX (US); Erwan Le Roy, Newark, CA (US); Theodore Lundquist, Milpitas, CA (US); William B. Thompson, Loa Altos, CA (US); Catherine Kardach, Saratoga, CA (US)

(73) Assignee: Credence Systems Corporation, Milpitas, CA (US)

( * ) Notice: Subject to any disclaimer, the term of this patent is extended or adjusted under 35 U.S.C. 154(b) by 200 days.

(21) Appl. No.: 10/758,146

(22) Filed: Jan. 14, 2004

(51) Int. Cl.
*G01L 21/30* (2006.01)
*H01L 21/00* (2006.01)

(52) U.S. Cl. .......................... 216/59; 216/60; 216/63; 216/66; 250/492.3; 438/14; 438/16; 438/17; 204/192.33; 700/121

(58) Field of Classification Search .................. 216/59, 216/60; 438/14, 16, 17; 204/192.33, 192.34; 700/121; 250/492.3
See application file for complete search history.

(56) References Cited

U.S. PATENT DOCUMENTS

| 5,948,217 A | 9/1999 | Winer et al. ........... 204/192.34 |
| 6,518,571 B1 | 2/2003 | Talbot et al. ............... 250/307 |
| 6,855,622 B1 * | 2/2005 | Le Roy et al. ............. 438/513 |
| 6,958,248 B1 * | 10/2005 | Roy et al. .................... 438/17 |

* cited by examiner

*Primary Examiner*—Shamim Ahmed (57) ABSTRACT

The backside navigation method of the present invention includes milling a fiducial opening through the substrate of an integrated circuit. The milling process is stopped when the fiducial opening reaches the bottom of a trench isolation structure. The trench isolation structure delineated by the fiducial opening may be imaged and registered to a computer aided design layout image to achieve sub-micron navigation resolution.

21 Claims, 7 Drawing Sheets

METHOD AND SYSTEM FOR INTEGRATED CIRCUIT BACKSIDE NAVIGATION

FIELD OF THE INVENTION

Embodiments of the present invention relate to diagnostic and editing techniques for integrated circuits, and more particularly to backside navigation having sub-micron resolution.

BACKGROUND OF THE INVENTION

Integrated circuit technology continually advances resulting in decreases in device dimensions, increased circuit speed, and the like. Accordingly, diagnostic and editing techniques also need to continue to improve. Integrated circuit diagnostic and editing techniques have undergone dramatic changes, due in part to two factors. The stacking of increasingly large numbers of metal layers has limited the access to lower metal layers from the wafer front side. In addition, the widespread user of flipchip mounting, wherein the integrated circuit is mounted face down on a packaging substrate, leaving only the backside of the die exposed, precludes front side access to the chip. As a result, backside diagnostics and editing of integrated circuits has become increasingly important.

A challenge in backside diagnostics and editing is locating the exact position of one or more regions (e.g., drain, source, gate, trace and/or the like). To effectively and accurately navigate, the diagnostic or editing tool needs to be accurately positioned and registered to the as fabricated integrated circuit. This is accomplished using the as designed circuit (e.g., computer aided design (CAD) layout). Current methods are unable to accurately register the as fabricated integrated circuit and the as designed circuit to within a few tens of nanometers.

SUMMARY OF THE INVENTION

A method of backside navigation having sub-micron resolution is disclosed. In one embodiment, a fiducial opening is milled through the substrate of an integrated circuit. The milling process is stopped when the fiducial opening reaches the bottom of a trench isolation structure. The trench isolation structure delineated by the fiducial opening may be imaged and registered to a computer aided design layout image. The registered images may be utilized to accurately determine the position of various device regions so that measurements or edits maybe accurately accomplished.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figures 1A, 1B:
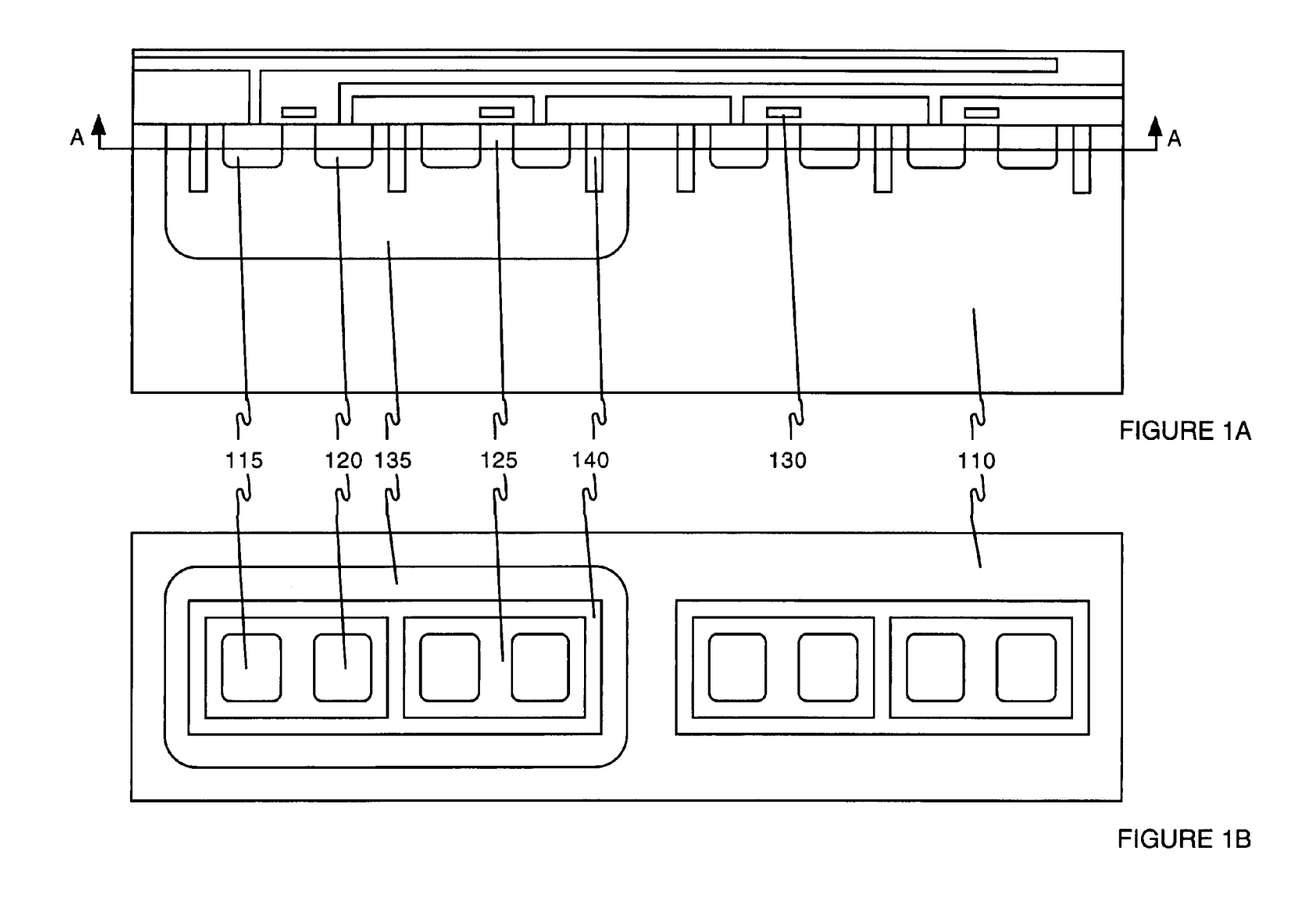
FIGS. 1A and 1B show an exemplary integrated circuit is shown.

Referring to FIGS. 1A and 1B, an exemplary integrated circuit is shown. FIG. 1A is a side cross sectional view of the exemplary integrated circuit. FIG. 1B is a top sectional view of the exemplary integrated circuit as seen from the backside without including the interconnects. The integrated circuit includes a substrate 110 having one or more devices fabricated on a first side (e.g., front side). The devices are composed of a plurality of dynamic device regions and a plurality of static device regions. The dynamic device regions may include source regions 120, drain regions 115, channel regions 125, gate regions 130 and the like. The static device regions may include well regions 135, trench isolation structures 140, buried layer, body region and the like.

The trench isolation structures 140 may be shallow trench isolation (STI) regions, deep trench isolation regions and/or other isolation structures. The depth of trench isolation structures 140 is generally greater than the depth of the dynamic device regions (source regions 120, drain regions 115, channel regions 125 and/or the like) in most advanced technology devices. Generally, the depth of the dynamic device are approximately 50–200 nm, trench isolation structures 140 are approximately 100–500 nm, and the static device regions are approximately 500–2000 nm. The depth of the dynamic regions is less than that of the static regions (e.g., the p-diffusion of source and drain regions is always shallower than the n-well it is in). It is appreciated that the above-depths are for illustrative of the relative depth of current fabrication processes.

Figure 2A:
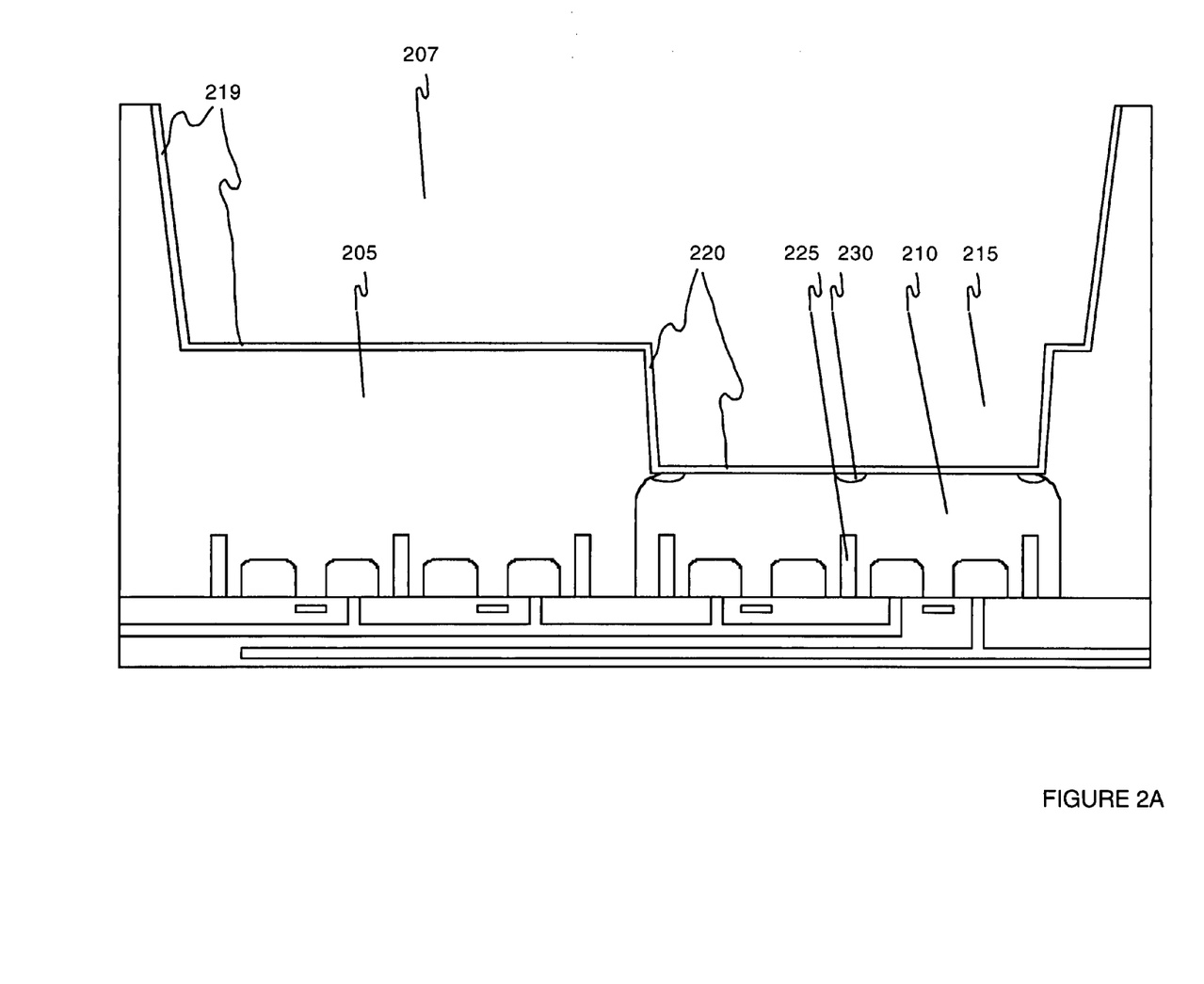
FIGS. 2A–2C show an illustration of an exemplary method of backside navigation, in accordance with one embodiment of the invention.
Figure 2B:
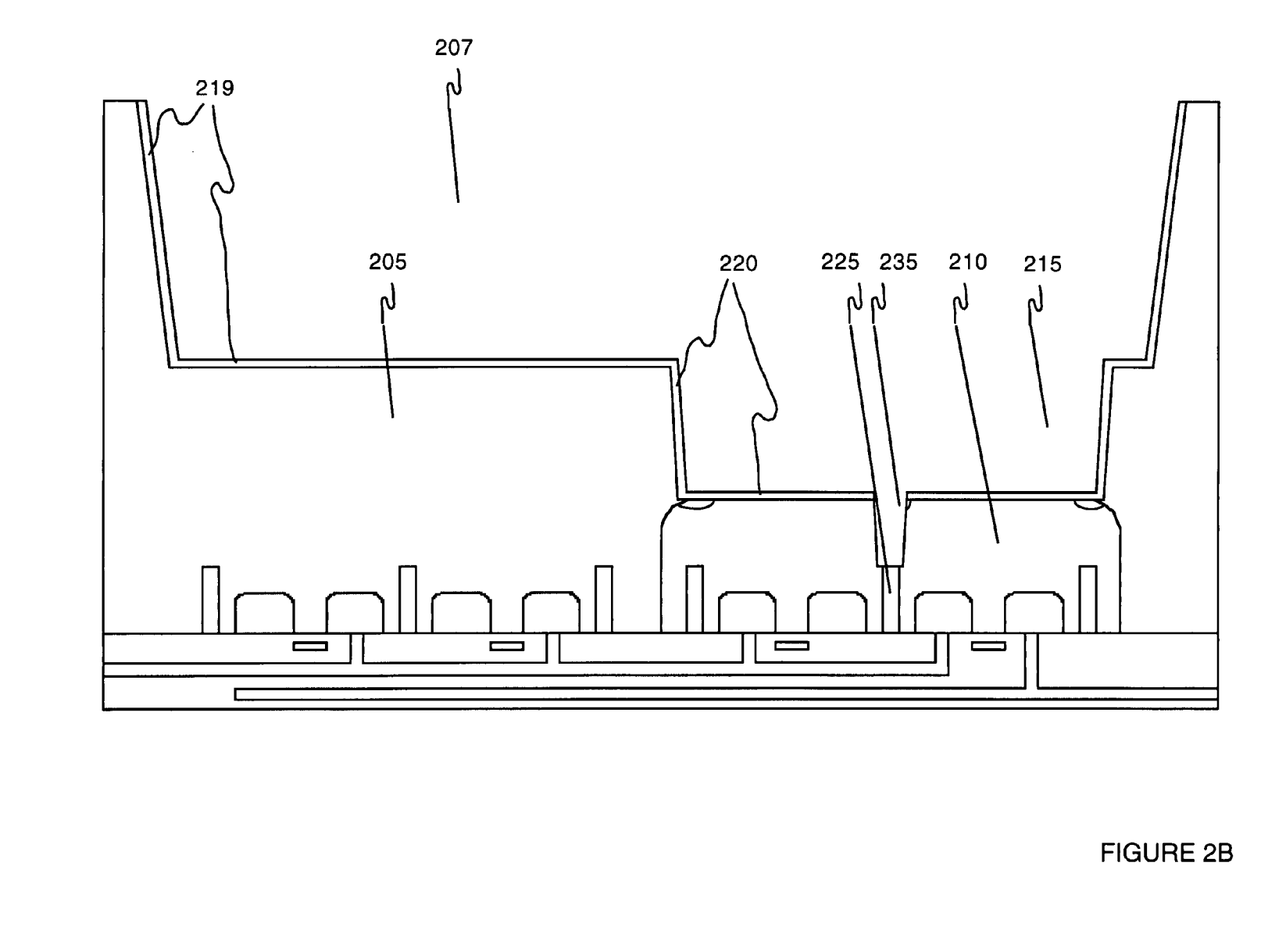
Figure 2C:
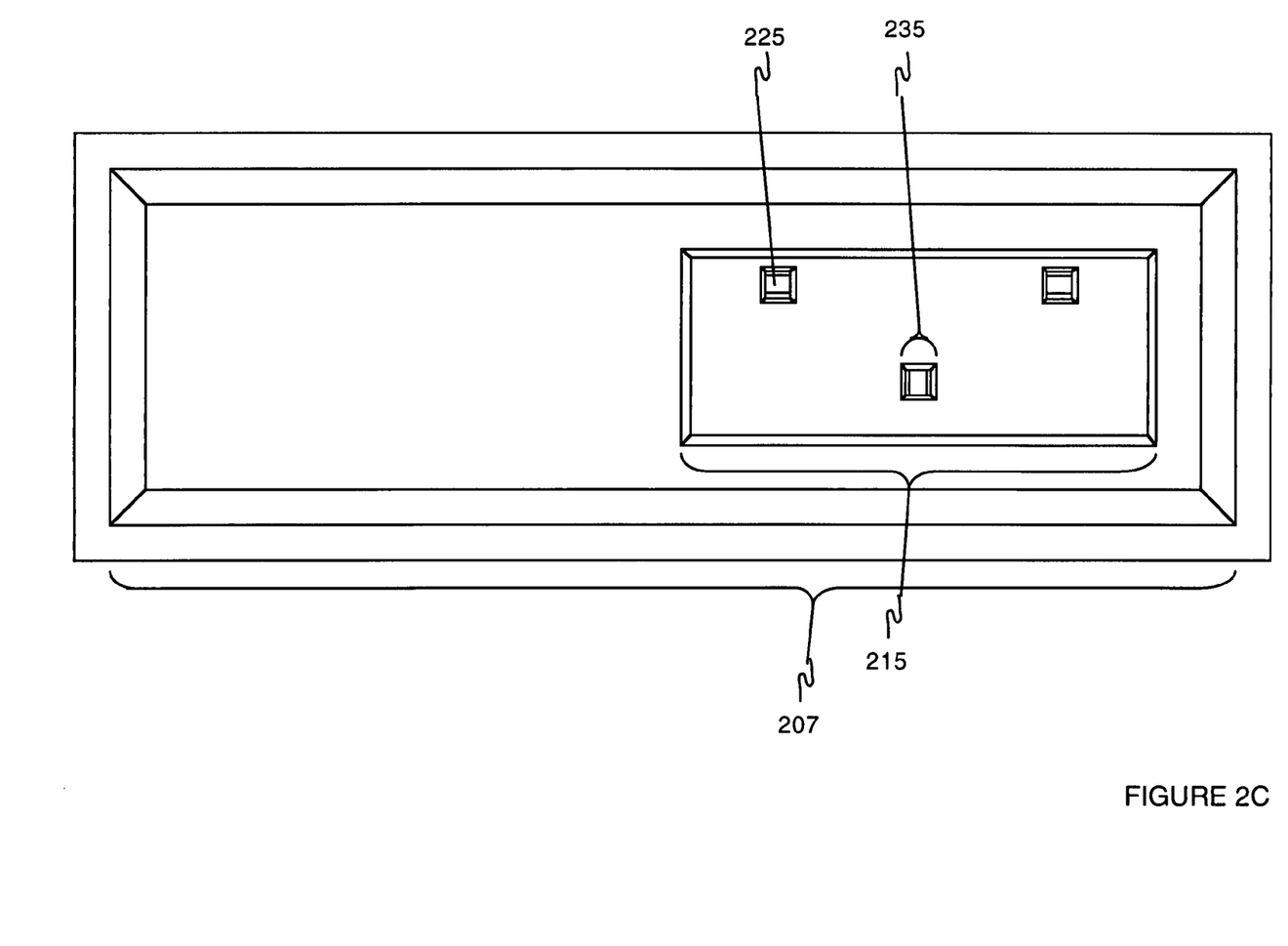

Referring now to FIGS. 2A–2C, an illustration of an exemplary method of backside navigation, in accordance with one embodiment of the invention, is shown. It is appreciated that FIGS. 2A–2C are shown with the integrated circuit flipped over, as compared to conventional illustrations of integrated circuits, because embodiments of the present invention are practiced substantially on the backside of the integrated circuit. As depicted in FIG. 2A, the exemplary method of backside navigation is illustrated on a side cross-section view of an exemplary integrated circuit. The exemplary integrated circuit is for illustrative purposes and is not intended to limit the scope of the invention.

Global thinning of the substrate (e.g., wafer, die) 205 may be utilized to enhance backside navigation accuracy. Thinning the substrate 205 increases the transparency of the substrate for optical imaging. An anti reflective coating (not shown) may be applied to the substrate 205 to further improve the optical transparency and to protect the substrate from subsequent chemical processing. Thinning the substrate 205 also decreases the amount of time consumed by one or more charged particle milling processes utilized in navigation and editing.

One or more device regions, such as polysilicon structures, metallization and/or the like may be located utilizing blind navigation, computer aided design (CAD) navigation, through silicon optical imaging and/or the like. The location of the device regions may be utilized to locate an initial opening 207. The initial opening 207 is utilized to remove the bulk of the substrate 205 in a field of view associated with the backside navigation method. The initial opening 207 in one implementation may be approximately 100–500 microns (μm) on a side and extends to within approximately 1.0–15.0 μm of one or more static device regions. The initial opening 207 may be formed utilizing a laser chemical etching (LEC), a focused ion beam or the like process. The initial opening 207 may also advantageously be utilized to reduce the aspect ratio of subsequently formed fiducial openings and access holes such as a metallization layer via.

An oxide layer 219 may be deposited in the initial opening 207. The oxide layer 219 protects the substrate 205 during subsequent processes, improves navigation (e.g., optical imaging of static device regions), and may also be utilized isolate traces formed during subsequent editing processes.

One or more static device regions 210, such as an n-well, within the initial opening may be located by a process such as through silicon optical techniques or computer aided design navigation based upon device dimensions. The imaged static device region is utilized to establish the location for forming a coarse fiducial opening 215.

One or more coarse fiducial openings 215 maybe formed in the substrate 205, and may be contained within other initial openings 207, that are required at a greater distance than can be contained within a single initial opening. In one implementation, the substrate thinning process can thin the substrate 205 to a level where an initial opening 207 can be omitted and only a coarse fiducial opening like 215 would be performed. The coarse fiducial openings 215 extend to the boundary (e.g., bottom) of the one or more imaged static device regions 210, such as well region 135, buried layers and the like. In one implementation, the coarse fiducial openings 215 extend to the boundary (e.g., bottom) of a particular n-well region and is approximately 50–300 μm on a side. It is appreciated that precise endpoint control while forming the coarse fiducial opening is critical to avoid damaging of dynamic device regions. For example, a coarse fiducial opening 215 is milled down through the substrate 205 until the boundary of the n-well 210 is reached. In one implementation, a laser chemical etching (LCE) process may be utilized to mill much of the coarse fiducial opening 215. In another implementation, a charged particle beam milling application may be utilized to form the coarse fiducial opening 215.

Focused ion beam systems use a finely focused beam of gallium ions (Ga+) that can be operated at low beam currents for imaging or high beam currents for site specific sputtering or milling. The ion beam hits the sample surface and sputters a small amount of material, which leaves the surface as either secondary ions or neutral atoms. The ion beam also produces secondary electrons. As the ion beam rasters over the sample surface, the signal from the secondary ions or secondary electrons may be detected to form an image. At low ion beam currents, very little material is sputtered. At low ion beam currents image resolutions of approximately 5 nm can be achieved. At higher ion beam currents, a substantial amount of material can be removed by sputtering. Focused ion beam system also typically provide for introduction of chemical assists. The chemical assists are activated with the ion beam to provide selective chemical assisted etching or deposition.

The well regions are primarily passive components of transistors; therefore, changes to it ought to have minimal effect on transistor operation. However, leakage current may be created across the depletion region between the well region (e.g., n-doped) and substrate (e.g., p-doped) by the coarse fiducial opening. Normally, a voltage difference exists between these materials, which is separated by a depletion region. The lateral damage layer created by the milling process is typically tens of nano-meters deep. Between the well region and the substrate this damage layer is believed to have Schottky diode type electrical properties. The damage and the implanted beam atoms are readily removed by using a short time exposure to XeF2. By way of example and not limitation, E. Le Roy et al., U.S. Provisional Patent Application No. 60/294,716, filed May Feb. 28, 2003, which is hereby incorporated by reference, discloses a method of removing such damage and implanted beam atoms. An oxide may be deposited in the coarse fiducial opening. The interaction of the insulator precursors can be expected to minimize surface currents. The net effect is that any leakage would be small.

Accordingly, a dielectric layer 220 may be formed along semiconductor material proximate the coarse fiducial opening. In one implementation, the dielectric layer 220 is formed utilizing a focused ion beam assisted oxide deposition process. In another implementation, the dielectric layer 220 is formed utilizing an off-instrument tool for chemical vapor deposition (CVD). In yet another implementation, the dielectric layer is formed utilizing an off-instrument tool for spin-on dielectric deposition. The oxide layer 220 also protects the substrate 205 during subsequent processes and improves navigation (e.g., optical imaging of static device regions)

One or more trench isolation structures 225, located below the coarse fiducial opening, 215 are located. In one implementation, the proximate location of the trench isolation structures 225 may be determined from a reference layout (e.g., computer aided design layout file). In another implementation, doping deviations 230 in the well region 210 caused by the presence of trench isolation structures may be utilized. The trench isolation structure 215 is distinguishable because the implant under the trench isolation structure 225 does not travel as far. The oxide of the trench isolation structure 225 retards the n-well dopant ions from penetrating as deep into the substrate 215 as they do where there is no trench isolation structure 215. Therefore, a voltage contrast type image of the well region 210 shows lateral doping deviations 230 indicative of the presence of trench isolation regions 225. The image of the well region 210 showing the doping deviation 230 may be utilized to accurately place one or more fine fiducial openings 235 with respect to the trench isolation structures 225. Of course it is important that the endpointing of the coarse fiducial trench is before this doping deviation region is penetrated.

It is appreciated that, although integrated circuits continue to be scaled, the relative depths of static and dynamic regions will likely remain substantially proportional to their current depths. It is also appreciated that the width and depth of well regions 210 vary as a result of the scattering (e.g., range and standard deviation) characteristics of the implant processes used to form the well regions 210. The width and depth of the trench isolation structures are established by a single etching fabrication step. Accordingly, the trench isolation structures 225 are more accurately placed relative to the dynamic device regions than the well regions 210. Furthermore, the trench isolation structures 225 generally scale with the dynamic device regions. Thus, the trench isolation structures 225 provide a navigation aid having sub-micron resolution and even several nano-meter resolution for use in backside editing and the like.

As depicted in FIG. 2B, one or more fine fiducial opening 235, through the static device region, are formed. Each fine fiducial opening 235 delineates the bottom of a portion of a trench isolation structure 225. In one implementation the fine fiducial openings 235 may be formed by a charged particle beam and chemistry assisted etching. It is appreciated that precise endpoint control while forming the fine fiducial opening 235 is critical to avoid potential damage to dynamic device regions. In one implementation, a material contrast type endpoint with a charged particle beam may be utilized to halt the milling process upon reaching the trench isolation structures 225. The trench isolation appears dark relative to the substrate. Accordingly, structures (e.g., shallow and deep trench isolation regions) within the substrate are identified that are as far away as possible from dynamic device regions (e.g., active diffusion regions) yet provide for sub-micron navigation accuracy. The width of the fine fiducial openings should be scaled to be more than the width of the trench isolation structure, so that the x and/or y location of the trench isolation can be determined. However, excessively wide fine fiducial openings should be avoided, as proximity to the static device regions may cause device malfunctions.

As depicted in FIG. 2C, the trench isolation structures 225 are delineated by the fine fiducial openings 235. The fine fiducial openings 235 are effectively markers that can be utilized to register an image of the delineated trench isolation structure 225 to a reference image (e.g. computer aided design layout file). Forming a plurality of fine fiducial openings 235 enables increased accuracy in correlating the as fabricated integrated circuit (e.g., image of the trench isolation structures 225) with the as designed integrated circuit (e.g., CAD layout image). Alternatively or in addition, a single fine fiducial opening 235 may be utilized to expose a feature (e.g., corner) of the trench isolation structure 225 such that registration in two dimension may be achieved from the single fine fiducial opening 235.

The trench isolation structures 225 may be imaged with sub-micron resolution utilizing a charged particle beam. In one implementation, the trench isolation structures are imaged with an electron beam, a focused ion beam or the like. Focused ion beam imaging should be performed at a reduced beam current. Exposing with a reduced beam current enhances resolution while minimizing damage. Sub-pico Ampere beam current imaging can obtain a resolution diameter of 5 nm or less. The accuracy obtained is thus potentially better than the tolerances in fabrication. Although the resolution of such imaging exceeds the current accuracy of fabrication processes, the imaging method will continue to be useful as further improvements in device scaling (e.g., reduction in the width of trench isolation structures) are achieved.

The acquired image is registered to a reference image. The reference image can be an as designed (e.g., theoretical) image, such as a computer aided design layout image (e.g., electronic file from which a trench isolation structure mask is fabricated). The reference image may typically have a higher resolution than the acquired image. Registering the acquired image and the reference image may include various preprocessing of one or both images. Registering the images also includes generating a cross correlation image, over sampling the cross correlation image, determining an offset of the over sampled cross correlation image, and aligning the reference image and the acquired image according to the determined offset.

Typically, a plurality of coarse fiducial openings may be formed in an initial opening, and one or more fine fiducial openings will be formed in each coarse fiducial opening to define a registration. For example, two portions of trench isolation structures, delineated by fine fiducial openings perpendicular to a dimension of interest, may be utilized for registration. If registration in two dimensions is desired, three fine fiducial openings should be formed. However, if magnification and orientation, from registration of the coarse fiducial opening, is accurate, than a single fine fiducial opening may be capable of providing for accurate registration in two dimensions.

Position control information may be derived from the registered images. Accordingly the position control information may be provided to a controller to move the integrated circuit into a desired position, steer the focused ion beam to a particular area and/or control diagnostic tools and/or editing tools. For example, the position control information may be utilized to determine the center position between device regions. The focused ion beam may then be positioned at the determined center position to mill a through substrate contact to a buried metal layer, trimming a static or dynamic device region or the like. Position control information can also be used to instruct the focused ion beam tool to create new fiducial marks on the backside substrate 205 for navigation by other tools.

Figure 3A:
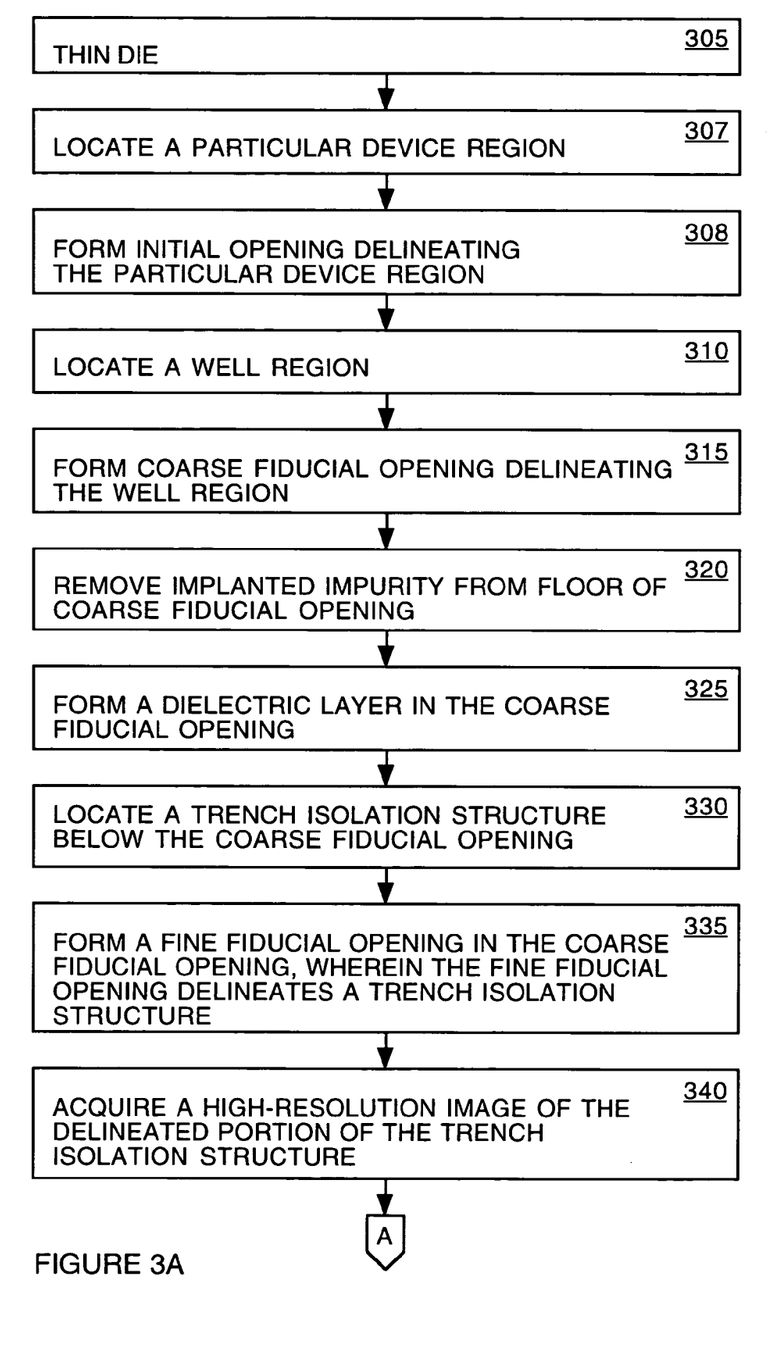
FIGS. 3A and 3B show a flow diagram of a method of backside navigation, in accordance with one embodiment of the invention.
Figure 3B:
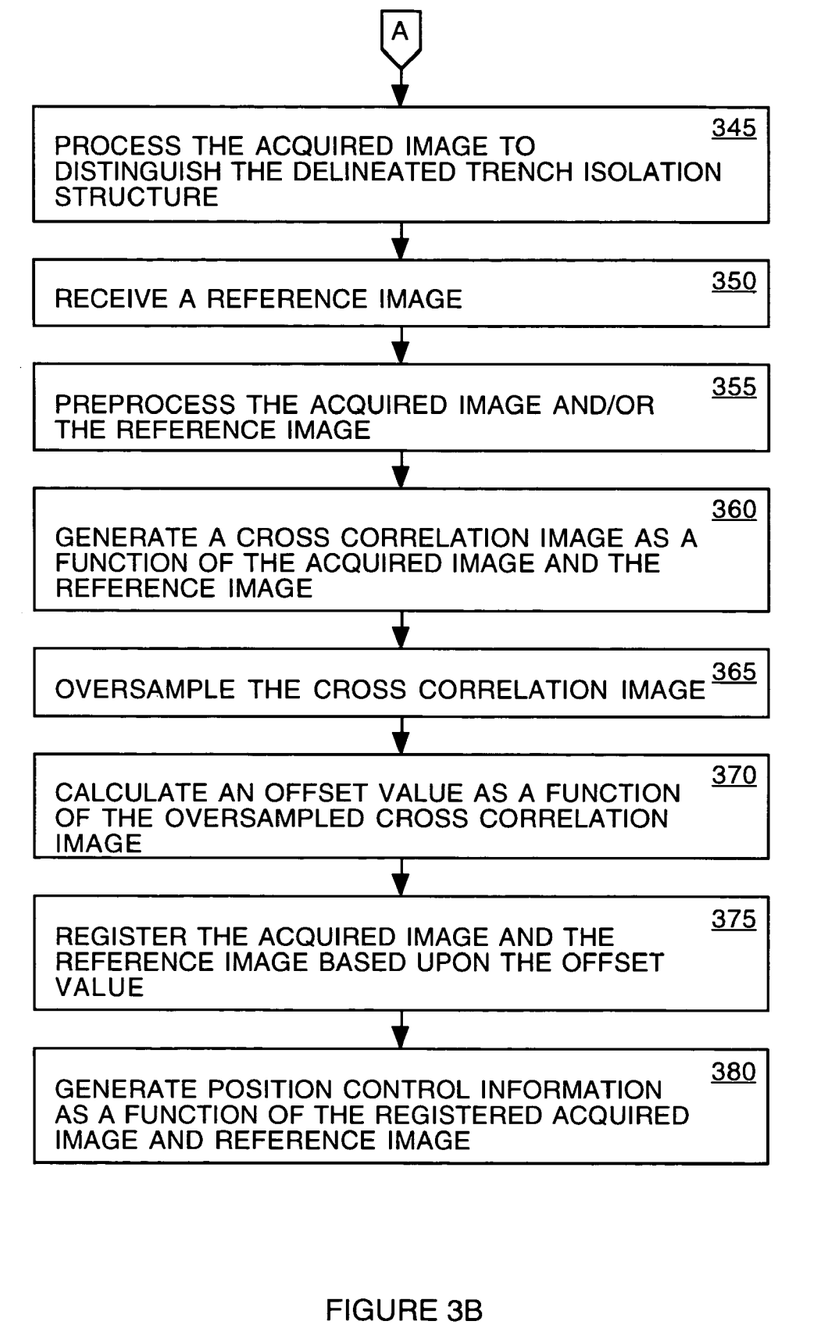

Referring now to FIGS. 3A and 3B, a flow diagram of a method of backside navigation, in accordance with one embodiment of the invention, is shown. The method of backside navigation comprises forming one or more fiducial openings delineating trench isolation structures. An image of the delineated trench isolation structure may then be registered to an as designed (e.g., theoretical) layout image.

As depicted in FIG. 3, the method may include the optional process of global thinning of the die to enhance backside navigation accuracy, at 305. In one implementation, any well-known in the art backside lapping process (e.g., chemical mechanical polishing (CMP)) may be utilized to thin the die to approximately 10–100 microns ($\mu$m) remaining thickness. Thinning the die increases the transparency of the substrate for optical imaging. Thinning the die also decreases the amount of time consumed by one or more charged particle milling processes utilized in navigation and editing.

At optional process 307, one or more particular device regions, such a polysilicon structures, metallization and/or the like, may be located utilizing blind navigation, computer aided design navigation, through silicon optical imaging and/or the like. In one implementation, infrared (IR) imaging is utilized to locate one or more device regions and to estimate the distance between the backside and front side surfaces of the die. The resolution of the IR imaging is, however, limited to the wavelength of the light (e.g., 1 $\mu$m). Some increased resolution (e.g., a faction of a wavelength) can be achieved by employing an appropriate image-processing algorithm. By way of example and not limitation, M. Sengupta et al., U.S. patent application Ser. No. 10/159,527, filed May 30, 2001, which is hereby incorporated by reference, discloses a method of navigation utilizing IR imaging. The location the particular device regions may be utilized to locate an initial opening.

At optional process 308, the initial opening is formed utilizing a laser chemical etching, a focused ion beam or the like process. In one implementation, the initial opening is approximately 100–500 µm on a side and extends to within approximately 1–15 µm of one or more static device regions. The initial opening is utilized to remove the bulk of the substrate in a filed of view associated with the backside navigation method.

At 310, one or more static device regions (e.g., well regions, buried layers and/or the like) are located utilizing blind navigation, CAD navigation and or through silicon optical imaging. In one implementation, infrared (IR) imaging is utilized to locate one or more static regions. The imaged static device region is utilized to establish the location for forming a coarse fiducial opening.

At 315, one or more coarse fiducial openings are formed in the substrate. The coarse fiducial openings extend to the boundary (e.g., bottom) of the static device region. In one implementation, a coarse fiducial opening extending down to within a few microns of the bottom of the IR imaged n-well is formed. The width of the coarse fiducial opening is approximately 50–300 µm. In one implementation, a laser chemical etching (LCE) process may be utilized to mill most of the coarse fiducial opening. In another implementation, a focused ion beam (FIB) application may be utilized to mill the coarse fiducial opening.

For a focused ion beam application, an anti-reflective coating (ARC) may be deposited on the backside of the substrate. All pins on the die are grounded. At the location where the coarse fiducial is to be milled, the anti-reflective coating (ARC) is removed and the silicon surface is cleaned. The focused ion beam (which is comprised of positive Ga ions) is variably or sequentially scanned across the substrate, where the coarse fiducial opening is to be located. The focused ion beam scanned area (e.g., coarse fiducial opening) may be approximately 100–300 µm on a side, has an energy of approximately 20–50 kilo-electron Volts (keV) and a beam current of approximately 4–100 nano-Amperes (nA). The ion milling may be performed in the presence of a chemical such as $XeF_2$ or $Cl_2$ to chemically assist in removing material.

Precise endpoint control over the milling of the coarse fiducial opening is critical to avoid damaging of dynamic device regions. In one implementation, a voltage contrast detection endpointing method is utilized. The energy of the focused ion beam is reduced as the well region is approached during coarse fiducial trench etching. For example, at approximately 10 µm from the boundary of the well, which may be determined by fringe contrast in the IR image or using a programmable script that predicts the depth of the coarse fiducial opening according to calculations of the removal rate, the focused ion beam parameters are lowered. The energy may be decreased to approximate 10–15 keV and the beam current may be decreased to typically less than 10 nA.

The transient voltage contrast effect is seen when the floor of the coarse fiducial opening approaches sufficiently close (approximately 1–5 µm) to a bottom boundary of the n-well region. The n-well region appears brighter than the substrate as it is first contacted, then returns to being dark after a few imaging scans of the ion beam. For example, a beam current of 12 nA with a field of view (FOV) of 250×250 µm, the transition from bright to dark occurs after two imaging scans. Accordingly, the FIB milling process may also be utilized for endpointing by detecting the well region to stop the etching. By way of example and not limitation, E. Le Roy et al., U.S. Provisional Patent Application No. 60/450, 636 filed 28 Feb. 2003, incorporated herein by reference, describes the transient voltage contrast effect, which can be seen during milling with a focused ion beam.

The focused ion beam process utilized for milling results in gallium being implanted at the floor of the coarse fiducial opening. At optional process 320, the implanted gallium may be removed by chemically etching the floor of the coarse fiducial opening. In one implementation, the floor of the coarse fiducial is exposed to $XeF_2$, which spontaneously etches the surface of exposed semiconductor. For example, with a chamber partial pressure of $2-5 \times 10-5$ Torr of $XeF_2$ for a time of 8–15 seconds. The removal of gallium may be confirmed by low light reflectance, and sufficiently smooth surface topography as confirmed by light scattering, at the floor of the coarse fiducial opening.

At 325, an oxide is formed along semiconductor material proximate the coarse fiducial opening. In one implementation, a dielectric layer of approximately 30–200 nanometers (nm) is deposited. For example, FIB assisted oxide deposition may be provided by introducing a partial pressure of a silicon oxide precursor, such as Di-Butoxy-Di-Acetoxy (DBDAS), Tetraethoxysilane (TEOS), Tetramethylcyclotetrasiloxane (TMCTS), Octamethylcyclotetrasiloxane (OMCTS), Pentramethylcyclotetrasiloxane (PMCPS), Dodecamethylcyclopentasiloxane (DMPS), Tetrakis (dimethysylsiloxy)silane (TDMSS) or the like. A partial pressure of about $2.5 \times 10-5$ Torr for DBDAS decomposition is provided for about 35 minutes at room temperature. Approximately 120–140 nm of oxide is deposited at a beam current density of approximately $0.02-0.2$ pA/µm$^2$ and a beam energy of approximately 1–15 keV. An ultraviolet light treatment and/or thermal cycle may be performed to improve the voltage contrast created by the deposited oxide.

In another implementation, the dielectric layer is formed utilizing an off-instrument tool for chemical vapor deposition (CVD). The dielectric layer improves navigation (e.g., voltage contrast, optical imaging); while it enables trace rerouting associated with subsequent editing processes and protects the substrate from FIB edit chemistries. Furthermore, the preferred thickness of the dielectric layer is substantially equal to the desired ARC thickness.

As the well regions are a passive component of a transistor, changes to it ought not to effect transistor operation. However, leakage current may be created across the depletion region between the well region (e.g., n-doped) and substrate (e.g., p-doped) by the coarse fiducial opening. Normally, a voltage difference exists between these materials, which is separated by a depletion region. The lateral damage layer created in the semiconductor by focused ion beam milling is approximately 30 nm or less. Between the well region and the substrate this damage layer is believed to have Schottky diode type electrical properties. Gallium that is implanted laterally results in a geometric shift in the depletion region toward the n-doped region, as a result of gallium being a p-dopant. It is appreciated that p-well regions in n-doped substrate also have similar issues. To reduce such geometric shift of the depletion region, a dielectric layer may be deposited in the coarse fiducial opening. The interaction of the insulator precursors can be expected to convert some of the damage layer into insulator as well. The net effect is that any leakage would be small.

At 330, one or more trench isolation structures below the coarse fiducial openings are located. In one implementation, the proximate location of the trench isolation structures may be determined from a reference layout (e.g., computer aided design layout file, trench isolation mask file). In another implementation, doping deviations in the well region caused by the presence of trench isolation structures may be utilized. In one implementation, the floor of the coarse fiducial opening is imaged, utilizing the focused ion beam, to detect doping deviations in the implanted well region indicative of the presence of trench isolation structures. The resulting secondary electrons are detected to form an FIB image of deviations in the implanted well region caused by the presence of trench isolation structures. Imaging may be performed at a beam current of 30 keV, and a beam current of approximately 500 pico-Amperes (pA).

When forming an n-well voltage contrast, which is not very far into the n-well, the pattern of the doping deviation indicative of the location of the trench isolation structure is distinguishable. The trench isolation structure is distinguishable because the implant under the trench isolation structures does not travel as far. More specifically, during the semiconductor manufacturing process the trench isolation oxide retards the dopant ions from penetrating as deep into the substrate as they do where there are no trench isolation structures. The resulting doping deviation may be between 100–500 nm. Therefore, a voltage contrast type image of the n-wells shows the doping deviation. The image of the n-well region showing the doping deviation may be utilized to enable accurate placement of one or more fine fiducial openings with respect to the trench isolation structures.

It is appreciated that, although integrated circuits continue to be scaled, the relative depths of static and dynamic regions will likely remain substantially proportional to their current depths. It is also appreciated that the width and depth of well regions vary as a result of the scattering (e.g., range and standard deviation) characteristics of the implant processes used to form the well regions. The width and depth of the trench isolation structures are established by a single etching fabrication step. Accordingly, the trench isolation structures are more accurately placed relative to the dynamic device regions than the well regions. Furthermore, the trench isolation structures generally scale with the dynamic device regions. Thus, the trench isolation structures provide a navigation aid having sub-micron resolution and even several nano-meter resolution for use in backside editing and the like.

At 335, one or more fine fiducial openings are formed. Each fine fiducial opening delineates the bottom of a portion of a trench isolation structure. In one implementation the fine fiducial openings may be formed by a focused ion beam and chemistry assisted etching. A halogen compound may be the assisting chemistry. Delineating the trench isolation structures may also include employing a surface final flush of $XeF_2$ or the like. A material contrast type secondary electron endpoint with a charged particle beam may be utilized to halt the milling process upon reaching the trench isolation structures. The image for detecting the material contrast (e.g., silicon/oxide secondary emission differences) may be done at a beam current of approximately 10–500 pA, and ion energy of approximately 10–30 keV. The fine fiducial opening is very small (e.g., 1×1 μm on a side) and therefore the current is on the order of only 10 pA. The ability to generate a material contrast image of the delineated trench isolation structure is much easier than that of the n-wells.

The width of the fine fiducial openings should be scaled to be more than the width of the trench isolation structure, so that the x and/or y location of the trench isolation can be determined. However, excessively wide fine fiducial openings should be avoided, as proximity to the static device regions may cause device malfunctions. For example, a fine fiducial opening having an opening of 2×2 μm a trench isolation structure having a width of 1 μm.

Although embodiments are described herein with reference to n-well, it is appreciated that embodiments of the present invention may also be applied to p-wells. Likewise, it is appreciated that embodiments of the present invention may also be applied to integrated circuits fabricated to have both n-wells and p-wells.

The fine fiducial openings are effectively markers that can be utilized to register the image of the delineated trench isolation structure to a reference image (e.g. computer aided design layout file). Forming a plurality of fine fiducial openings enables increased accuracy in correlating the as fabricated integrated circuit with the as reference file.

At 340, a high-resolution image of the trench isolation structure is acquired. In one implementation, the trench isolation structures are imaged with a charged particle, such as a focused ion beam. Imaging the trench isolation structures should be performed by exposing the floor of the fine fiducial opening with a reduced beam current. Exposing with a reduced beam current enhances resolution while minimizing damage. In one implementation the beam current is approximately 200 femto-Amperes (fA) to 10 pA. Sub-pico Ampere beam current imaging can obtain a resolution diameter of 5 nm or less. The accuracy obtained is thus potentially better than the tolerances in fabrication.

At optional process 345, the acquired image of the trench isolation structures may be processed to better define the trench isolation structures. For example, an unprocessed image would show the trench isolation structure, n-wells, substrate and the like as very dark. By processing the image, the dielectric material of the trench isolation structure is shown as a dark region while the n-wells, substrate and the like are shown as lighter regions. Accordingly, the trench isolation structure in the acquired image is more readily distinguishable.

At optional process 350, a reference image is received. The reference image can be an as designed image (e.g., theoretical), such as a computer aided design layout image (e.g., trench isolation mask or the like).

At optional process 355, the reference image and the acquired image may be preprocessed to decrease differences there between. Preprocessing may include rotation adjustment, magnification adjustment, intensity adjustment and/or filtering. For example, rotational adjustment may include computing an angle θ, using Radon transforms, to characterize the difference between angular orientations of the two images. Based upon the angular orientation, the acquired image and/or the reference image can be rotated (e.g., digital signal processing). Magnification adjustment may comprise matching the magnification between the acquired image and the reference image. The magnification adjustment may be provided by a 3-point alignment and layout overlay technique. The 3-point alignment technique includes locking the acquired image to the reference image at three positions and then adjusting the magnification of one or both of the images. The overlay technique includes overlaying the acquired image over the reference image and then similarly adjusting the magnification of one or both of the images. To match intensity variations, gray levels may be assigned to the type of feature in the reference image matched to intensities in a corresponding optical image of the type of feature. The intensities of the two images may be normalized by using known histogram equalization techniques. Equalizing intensities of the two images tends to improve alignment quality. The resolutions may be adjusted by applying filtering techniques to the reference image and/or the acquired image. The filtering techniques may include general high or low pass frequency filter or a point spread function (PSF). The PSF is also known as an impulse response function or a transfer function. The filter component may be utilized to lower the resolution of the higher resolution reference image with a general low-pass frequency filter or a point spread function. In one implementation, the spread function is characteristic of system that produced the acquired image.

At optional process 360, a cross correlation image is generated as a function of the reference and the acquired images. In one implementation, the cross correlation image can be calculated from two images, denoted by f and g, according to Equation (1):

$$c(x,y)=\Sigma_{ij} f(i,j) g(i-x, j-y) \quad (1)$$

In Equation (1), an ordered pair (x,y) refers to an image pixel with x coordinate x and y coordinate y; similarly, (i,j) denotes a pixel with x coordinate i and y coordinate j; c(x,y) refers to a (x,y) pixel of the cross correlation image; f(x,y) and g(x,y) refer to a (x,y) pixel of the image f and the image g, respectively. According to Equation (1), in the cross correlation image, a pixel c(x,y) characterizes an overlap of the two images for relative displacements x in the x direction, and y in the y direction. The cross correlation image can be calculated directly by following the summation in Equation (1). Alternatively, the two images, f and g, can be Fourier transformed first to obtain two Fourier images, F and G, respectively. The cross correlation image can be obtained by inverse Fourier transformation from the product of one of the Fourier images, say F, and the complex conjugate of the other Fourier image, in this case, G*. Optionally, Fourier transformation can be performed by fast Fourier transform methods.

At optional process 365, the cross correlation image is oversampled (e.g., interpolated). Oversampling produces an oversampled image that has extra sub-pixel points generated from the original point of the cross correlation image. For example, oversampling can generate sub-pixel points that are 0.25 or 0.1 pixels apart. In one implementation, spatial domain interpolation techniques, such as nearest neighbor, bilinear or cubic spine interpolation, may be employed. The enlarging technique may exclude frequency content from the enlarged cross-correlation image. The excluded frequency content includes frequencies missing from the measured image due to the finite resolution.

At optional process 370, an offset value is calculated as a function of the oversampled cross correlation image. The offset value characterizes the misalignment between the reference image and the acquired image. In one implementation, a maximum correlation value in a cross correlation image is determined. The location of the maximum correlation value provides an offset value that describes a displacement to align the two images. Based upon the offset value, the reference image and the acquired image are registered to each other, at 375. By way of example and not limitation, M. Sengupta et al., U.S. patent application Ser. No. 10/159,527, filed May 30, 2003, which is hereby incorporated by reference, discloses a method of sub-resolution registering of images. Processes 355–375 may be iteratively repeated to increase the accuracy of the alignment.

It is appreciated that one or more fiducial markings may be made on the substrate, within the field of view, and/or indicated in the CAD layout file (e.g., trench isolation mask). The fiducial markings provide for maintaining the registration of the reference image and the acquired image. Thereafter, the fine fiducial openings may be sealed with a dielectric so as to protect the substrate from damage during subsequent processing. The fiducial markings on the substrate and/or CAD layout file may then be utilized for navigation during subsequent edits, particularly if the integrated circuit is transferred to another tool for diagnostics.

At 380, position control information may be derived from the registered images. The position control information may be utilized to precisely determine the position of a device such as a transistor, in one implementation. The precise position of the transistor may be utilized to perform diagnostic and/or editing operations. By way of example and not limiting, the trench isolation structures may be edited so as to improve device isolation and thus change the performance of at least a portion of the integrated circuit. Editing of the trench isolation structures may also be performed to bridge one or more trench isolation structures, so as to change the performance of at least a portion of the integrated circuit. A metal via may be formed to provide an electrical contact, or a metal trace may be cut. Furthermore, a well region, drain region, source region or the like may be trimmed.

Figure 4:
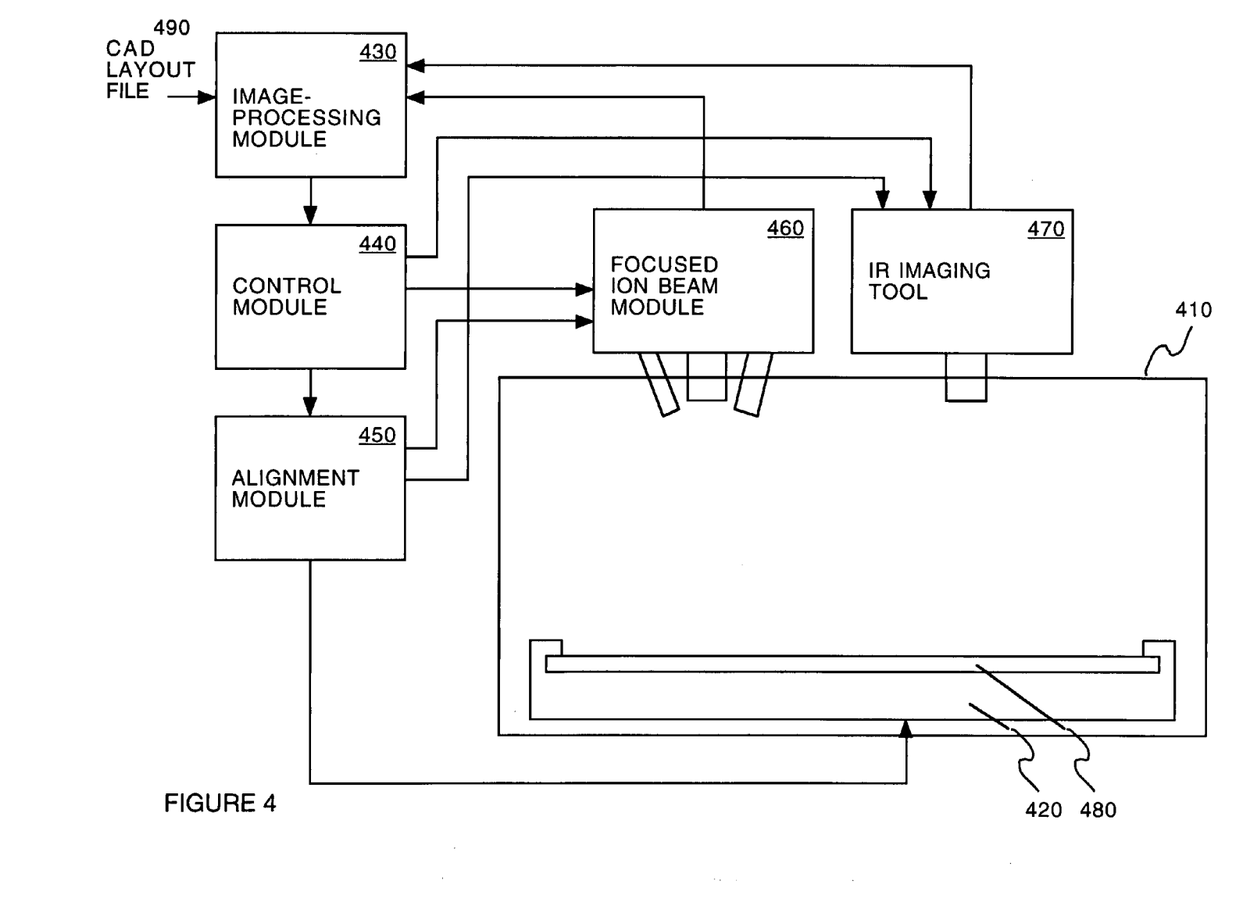
FIG. 4 shows a block diagram of an exemplary automated test equipment system for implementing embodiments of the present invention.

Referring now to FIG. 4, a block diagram of an exemplary automated test equipment (ATE) system for implementing embodiments of the present invention is shown. As depicted in FIG. 4, the exemplary automated test equipment system includes a vacuum chamber 410, a sample holder 420, an image processing module 430, a control module 440, an alignment module 450, a focused ion beam tool 460 and an infrared imaging tool 470. Although, the focused ion beam tool 460 and the infrared imaging tool 470 are shown as separate modules, it is appreciated that the functions may be integrated in a single module. A combined focused ion beam tool 460 and infrared imaging tool 470 allows coaxial orientation of the ion beams and the infrared beams.

An integrated circuit 480 is placed in the sample holder 420 within the vacuum chamber 410. Under control of the control module 440, the infrared imaging module 470 in combination with the image-processing module 430 may be utilized to determine the location of one or more operational regions.

The focused ion beam tool 460 mills an initial opening utilizing a high beam current, under control of the control module 440. The initial opening extends to within 10–100 μm of one or more well regions.

The focused ion beam tool 460 mills a coarse fiducial opening utilizing a high beam current, under control of control module 440. As the coarse fiducial opening approaches the boundary of the well region, the beam energy and current is reduced. The bottom of the coarse fiducial opening may be imaged, at the reduced beam energy, to better detect the boundary of the well region. The reduced beam energy and current reduce the rate of milling and increase the voltage contrast resolution of an image generated there from. Upon detection of the boundary of the well region utilizing the image processing module 430, the milling process is stopped for example by the control module stops 440. A focused ion beam assisted oxide layer may be deposited in the coarse fiducial opening by the focused ion beam module 460 under control of the control module 440.

The focused ion beam tool 460 mills a fine fiducial opening utilizing a low beam current, under control of the control module 440. The fine fiducial opening is aligned to a trench isolation structure. The fine fiducial opening may be milled at a lower beam current than the coarse fiducial opening. Milling at the reduced beam current provides for more precise milling of the fine fiducial opening. The reduced beam current reduces the rate of milling and increases the resolution of an image generated there from. The bottom of the fine fiducial opening may be imaged, at the reduced beam current, to detect the trench isolation region. Upon detection of the trench isolation structure utilizing the image-processing module 430, the control module 440 stops the milling process.

The focused ion beam tool 460 images the portion of the trench isolation structure delineated by the fine fiducial opening, under control of the control module 440. The image is formed utilizing a low beam current, such that a high-resolution image is acquired. The acquired image is processed along with a computer aided design layout image 490, by the image-processing module 430 to register the as fabricated integrated circuit 480 (e.g., acquired image) to the as designed integrated circuit (e.g., CAD image). Position control information may be determined from the registered images, by the image-processing module 430 in conjunction with the control module 440. Embodiments of the present invention may be capable of achieving position control information accuracy down to approximately 10 nm or less.

The position control information may then be utilized by the alignment module 450 to orientate the sample holder 420 and one or more tools (e.g., focused ion beam tool 460, IR imaging tool 470 and the like) relative to each other such that the tools acts upon a desired area of the integrated circuit 480 with sub-micron resolution.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of backside navigation comprising:
milling a fine fiducial opening through a substrate with a charged particle beam; and endpointing said fine fiducial opening upon delineating a trench isolation structure to create a registration marker to register an image of said trench isolation structure to a reference image.

2. The method according to claim 1, further comprising:
acquiring said image of said delineated trench isolation structure with said charged particle beam;
receiving said reference image; and
registering said acquired image and said reference image.

3. The method according to claim 2, wherein said reference image comprises a computer aided design layout image.

4. The method according to claim 1, wherein endpointing said fine fiducial opening comprises: imaging a floor of said fine fiducial opening with said charged particle beam; detecting a voltage contrast indicating said fine fiducial opening has reached said trench isolation structure; and stopping said milling of said fine fiducial opening upon detecting said voltage contrast.

5. The method according to claim 1, wherein a width of said fine fiducial opening is substantially sufficient to expose the width of said trench isolation structure.

6. A method of backside navigation comprising:
forming a fiducial opening, wherein a portion of a trench isolation structure is delineated; acquiring an image of said delineated portion of said trench isolation structure; registering said acquired image and a reference image; and
generating position control information as a function of said registered acquired image and said reference image.

7. The method according to claim 6, wherein said reference image comprises a computer aided design layout image.

8. The method according to claim 6, wherein forming said fiducial opening comprises: forming a coarse fiducial opening, wherein a static device region is delineated; depositing an oxide layer in said coarse fiducial opening; and forming a fine fiducial opening in said coarse fiducial opening, wherein said portion of said trench isolation structure is delineated.

9. The method according to claim 8, wherein forming said fiducial opening further comprises: imaging a boundary of said well region to detect a doping deviation in said well region indicative of a presence of said trench isolation structure; and milling said fine fiducial opening substantially at said detected doping deviation.

10. The method according to claim 8, wherein forming said fiducial opening further comprises: thinning a substrate prior to forming said fiducial opening; and imaging said substrate to detect said static device region.

11. The method according to claim 6, further comprising: making a fiducial marking proximate said fiducial opening; and maintaining said registration of said acquired image and said reference image as a function of said fiducial marking.

12. The method according to claim 6, wherein registering said acquired image and said reference image comprises: generating a cross correlation image as a function of said acquired image and said reference image; oversampling said cross correlation image; determining an offset of said oversampled cross correlation image; and aligning said reference image and said acquired image according to said offset.

13. The method according to claim 12, wherein registering said acquired image and said reference image comprises: preprocessing said acquired image, wherein preprocessing comprises one or more processes consisting of rotation adjustment, magnification adjustment, intensity adjustment and filtering.

14. The method according to claim 12, further comprising:
forming a plurality of fiducial openings, wherein each fiducial opening delineates a separate portion of a trench isolation structure within a field of view; acquiring an image of each said delineated portion of said trench isolation structure; registering said image of each delineated portion of said trench isolation structure to a corresponding trench isolation structure in a portion of a trench mask corresponding to said field of view; and
generating position control information as a function of said registered acquired images and said portion of said trench mask.

15. A method of forming a backside marker in an integrated circuit comprising: forming a coarse fiducial opening; forming a fine fiducial opening in said coarse fiducial opening, wherein said fine fiducial opening delineates a portion of a trench isolation structure.

16. The method according to claim 15, wherein said coarse fiducial opening delineates a static device region.

17. The method according to claim 16, wherein said static device region comprises a well region.

18. The method according to claim 15, wherein a focused ion beam milling process is utilized to form said fine fiducial opening.

19. The method according to claim 18, wherein forming said fine fiducial opening comprises: milling at a first focused ion beam current;
   milling at a second focused ion beam current as said fine fiducial opening approaches said trench isolation structure, wherein said second focused beam current is less than said first focused ion beam current; imaging said fine fiducial opening at said second focused ion beam current to detect a first voltage contrast indicative of said fine fiducial opening reaching said trench isolation structure; and stopping said milling upon detection of said first voltage contrast.

20. The method according to claim 15, wherein forming said coarse fiducial opening comprises: imaging said integrated circuit to detect a position of a static device region; milling at said first focused ion beam current; milling at said second focused ion beam as said coarse fiducial opening approaches said static device region; imaging said coarse fiducial opening at said second focused ion beam current to detect a second voltage contrast indicative of said coarse fiducial opening reaching said static device region; and stopping said milling upon detection of said second voltage contrast.

21. The method according to claim 15, further comprising forming an initial opening, wherein said coarse fiducial opening will be formed in said initial opening.

\* \* \* \* \*